United States Patent [19]
Nakata

[11] Patent Number: 5,349,604
[45] Date of Patent: Sep. 20, 1994

[54] SEMICONDUCTOR LASER SOURCE

[75] Inventor: Naotaro Nakata, Kyoto, Japan

[73] Assignee: Rohm Co., Ltd., Kyoto, Japan

[21] Appl. No.: 30,863

[22] Filed: Mar. 12, 1993

[30] Foreign Application Priority Data

Mar. 13, 1992 [JP] Japan ................................. 4-054820

[51] Int. Cl.⁵ ................................................ H01S 3/08
[52] U.S. Cl. .................................................... 372/103
[58] Field of Search ...................... 372/103; 359/95, 97

[56] References Cited
U.S. PATENT DOCUMENTS 4,808,804  2/1989  Krichever et al. ................. 359/197
5,231,464  7/1993  Ichimura et al. ............... 250/227.11

Primary Examiner—Rodney B. Bovernick
Assistant Examiner—Robert E. Wise
Attorney, Agent, or Firm—Nikaido, Marmelstein, Murray & Oram

[57] ABSTRACT

A laser diode and a lens are fixed onto a laser fixing member. A laser beam emitted from the laser diode passes through the lens, and a part of the laser beam passes through a pinhole provided to a beam restricting plate. The pinhole is formed so that its diameter is smaller than the laser beam diameter at the beam restricting plate. The laser beam is transmitted therethrough while being diffracted.

14 Claims, 5 Drawing Sheets

SEMICONDUCTOR LASER SOURCE

BACKGROUND OF THE INVENTION

1. Field of the Invention

The present invention relates to a semiconductor laser source for use in a laser beam printer, a laser facsimile apparatus, an image scanner for printing, a bar code reader, a copying apparatus, and a sensor.

2. Description of the Prior Art

A semiconductor laser source is used for various apparatuses such as the above-mentioned ones as an optical system using the coherence of a laser beam (e.g. as an optical pickup which is an application of a characteristic of the laser beam that it can be converged into a minute spot). In such an optical system, the light source has been reduced in size to reduce the power consumption. The size of the optical system has also been reduced. For example, as a lens system for coupling laser beams, the minute one with a diameter of several millimeters is known.

In the above-mentioned optical system, as shown in FIG. 1, a laser beam LB emitted from a semiconductor laser 1 is divided into a component A directly passing through a first surface $S_1$ and a second surface $S_2$ of a lens 2 and a component B first reflected by the second surface $S_2$ and first surface $S_1$ and then passing therethrough. Thus, the optical path lengths of the components A and B are different. Since the laser beam is highly coherent, deformation of a beam intensity pattern due to interference between the components A and B, that is, non-uniformity of a beam intensity (interference fringe) is caused in a beam spot formed. This nonuniformity of the beam intensity brings about various problems. For example, in a case where the optical system is employed for a sensor, noise increases when only a part of a laser beam is received by a sensing device, which may result in a malfunction.

In order to prevent the generation of nonuniformity of the beam intensity, generally, the lens is anti-reflection coated. The reflection prevention processing is performed by setting a plurality of lenses one by one at a planetary in a vacuum chamber and then applying to them a multi-layer coating including magnesium fluoride and titanium dioxide.

However, since a portion of the lens used to hold the lens is reduced because of the reduced size of the lens, setting of the lens in the above-mentioned multi-layer coating process is difficult, which complicates the work. In addition, the multicoating results in an increase of the cost.

SUMMARY OF THE INVENTION

An object of the present invention is to provide a semiconductor laser source with which the generation of nonuniformity of a beam intensity due to interference between laser beams can be prevented even though an optical system included therein is not anti-reflection coated.

To achieve the above-mentioned object, a semiconductor laser source of the present invention is provided with: beam emitting means including a semiconductor laser for emitting a laser beam; an optical system for transmitting the laser beam emitted from the beam emitting means; and a beam restricting member provided with an aperture for transmitting the laser beam emitted from the beam emitting means while diffracting it.

With such a feature, since the effect of the interference between laser beams due to the reflection when the laser beam passes through the optical system is removed by the diffraction which is made when the laser beam passes through the aperture provided in the beam restricting member, the nonuniformity of the laser beam intensity due to the interference is reduced. In addition, the laser beam having passed through the aperture has its peak of beam intensity at the optical axis.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
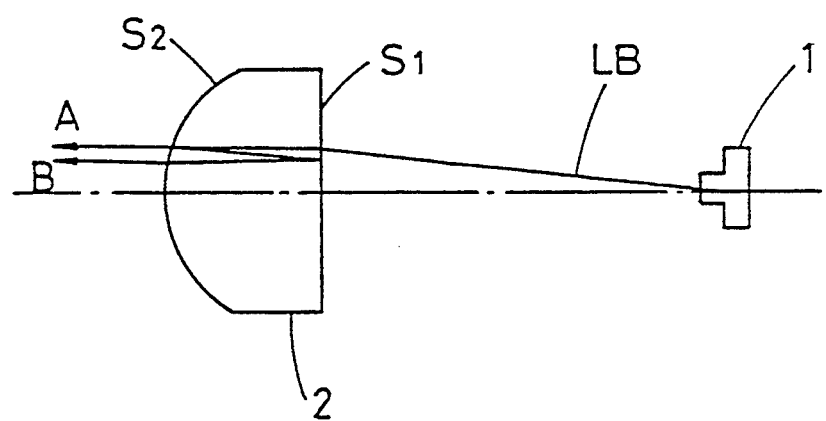
FIG. 1 is a view for explaining interference between laser beams due to reflection by a lens in a prior art.
Figure 2:
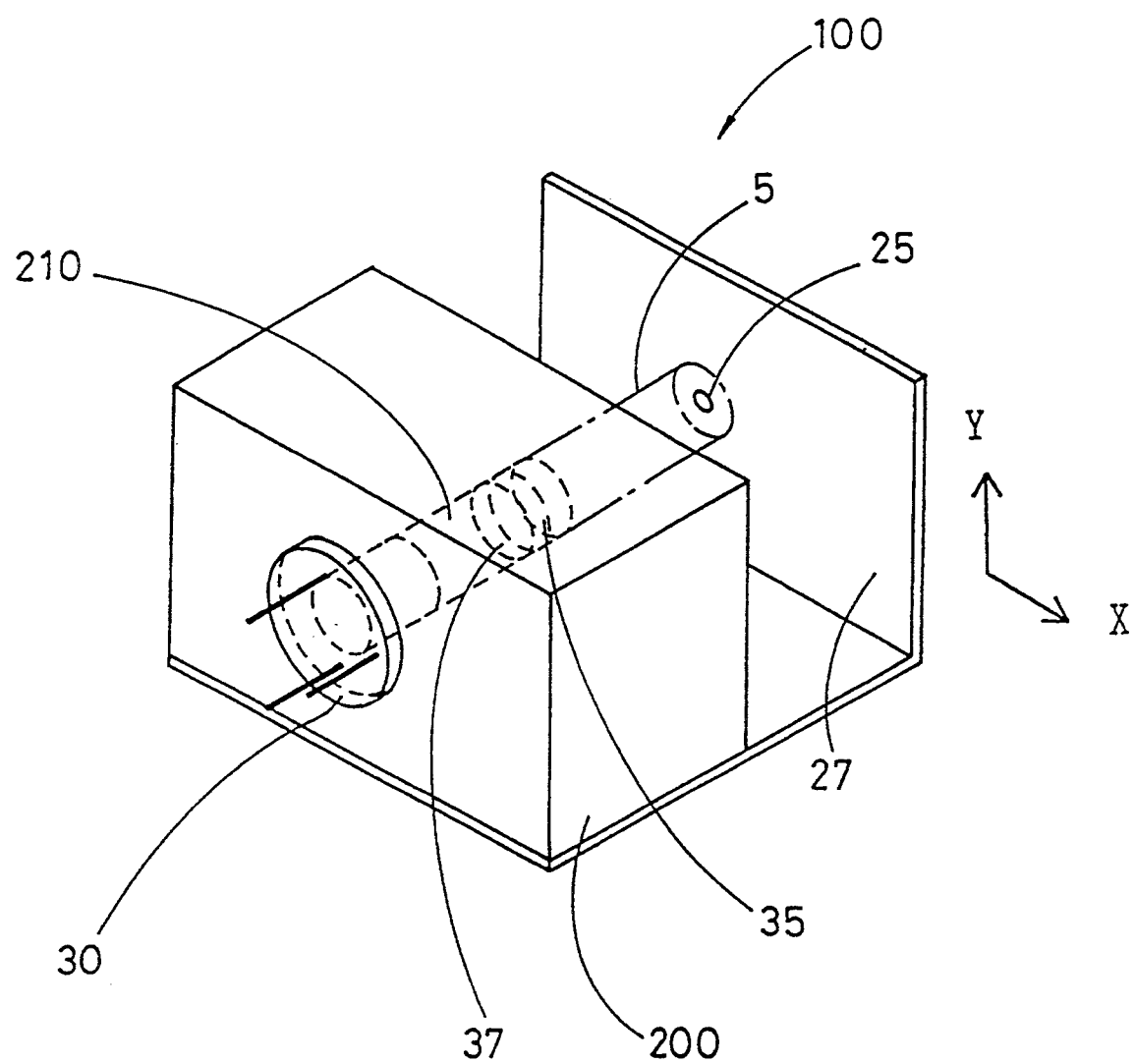
FIG. 2 is an appearance perspective view showing an arrangement of an embodiment of the present invention.

An embodiment of the present invention will hereinafter be described with reference to the drawings. FIG. 2 is an appearance perspective view showing a general arrangement of an embodiment of the present invention.

A semiconductor laser source 100 which is the embodiment of the present invention comprises a beam emitting device, an optical system, a fixing member and a beam restricting member.

The beam emitting device includes a laser diode 30 provided with a laser chip (not shown) for emitting one laser beam 5. The laser diode 30 is a package provided with a photodiode (not shown) for monitoring. The intensity of the laser emission from the laser diode 30 is controlled by monitoring it with the photodiode.

The optical system includes a lens 35 (with a diameter of 3 mm, a focal length of 5 mm) for transmitting the laser beam 5 emitted from the laser diode 30. The lens 35 is fixed inside a lens barrel 37 to constitute a collimator. A laser beam from the laser diode 30 passes through the lens 35 to be turned into a parallel beam (laser beam 5). While the parallel beam is formed by the lens 35 in this embodiment, the lens is not limited to a collimator lens; various types of lenses for producing convergent or divergent beams can be used as a coupling lens.

The fixing member includes a laser fixing member 200 in which a through hole 210 is formed. The laser diode 30 is fixed in a condition where its head is inserted into the hole 210. The lens 35 is fixed inside the hole 210 in a condition where it is fixed in the lens barrel 37.

The beam restricting member includes a beam restricting plate 27 of thin plate form fixed to the bottom of the laser fixing member 200. The beam restricting plate 27 is provided with a circular pinhole 25 (with a diameter of 1 mm) as the aperture for transmitting the laser beam having passed through the lens 35 while diffracting it. The beam restricting plate 27 transmits only a portion of the laser beam 5 which passes through the pinhole 25 and intercepts other portions. The pinhole 25 is formed so that its diameter is smaller than the diameter of the laser beam 5 at the beam restricting plate 27 and that its center coincides with the center of the laser beam 5. Thus, the pinhole 25 transmits only the central portion of the laser beam 5.

While the beam restricting plate 27 is fixed as shown in FIG. 2 in a condition where the distance with the lens 35 is maintained fixed and an XY adjustment cannot be made with respect to the laser beams, it may be arranged so that the XY adjustment can be made with respect to the laser beams in order to make it possible to make an adjustment so that the direction of the laser beams is not changed due to the diffraction by the beam restricting plate 27.

Figure 3:
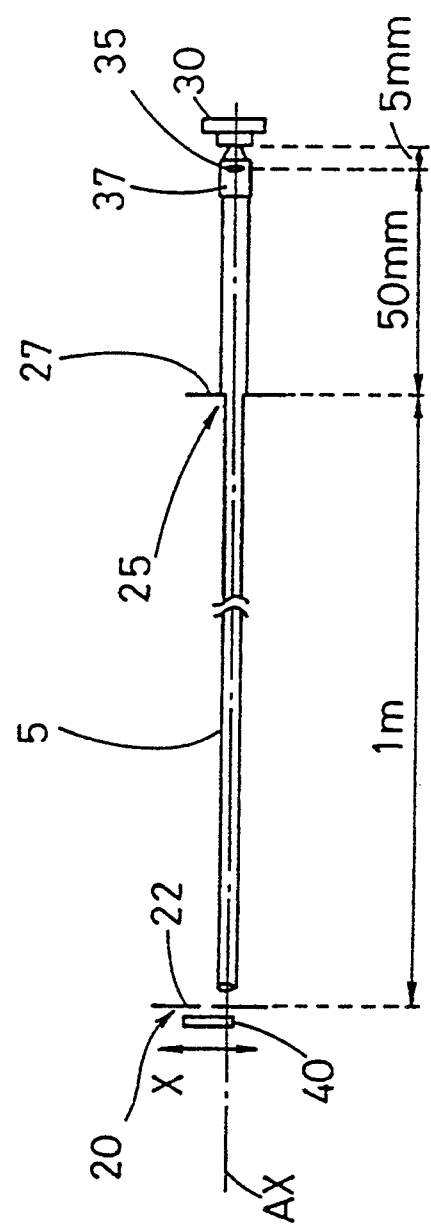
FIG. 3 is a schematic view showing an arrangement of a measuring system for measuring a profile of a laser beam intensity for each of a laser beam after it has passed through a pinhole and a laser beam before it is incident on the pinhole in the embodiment of the present invention.

How much the generation of nonuniformity of the laser beam intensity is actually restrained by the present invention was examined with a measuring system shown in FIG. 3 by the subsequently-described method. The distance between the laser diode 30 (the wavelength of a laser beam generated therefrom is 785.0 nm) and the lens 35 was 5 mm, and the distance between the lens 35 and the pinhole 25 was 50 mm. A plate 22 having a pinhole 20 (with a diameter of 100 μm) was placed one meter ahead of the pinhole 25 so as to be vertical to an optical axis AX. In front of the pinhole 20, a photodiode 40 was arranged so as to receive all portions of the laser beam passing through the pinhole 20. The plate 22 and the photodiode 40 were fixed onto an X stage so as to be movable in one direction (a direction of X).

Figure 6:
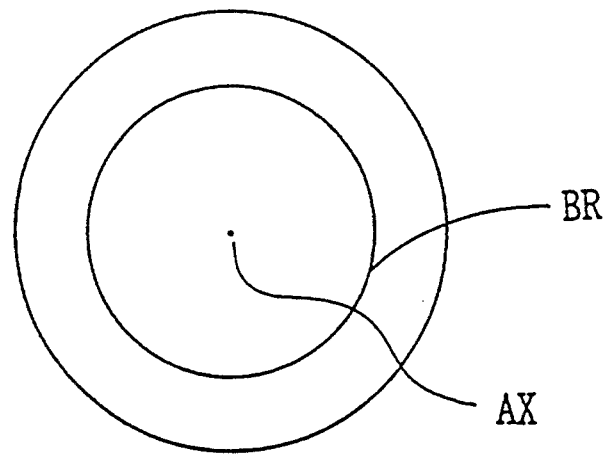
FIG. 6 schematically shows a spot of the laser beam after it has passed through the pinhole in the embodiment of the present invention.
Figure 7:
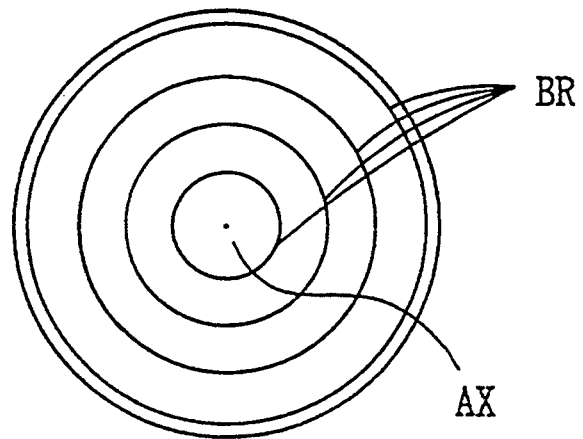
FIG. 7 schematically shows a spot of the laser beam before it is incident on the pinhole in the embodiment of the present invention.

FIG. 6 shows a spot of the laser beam 5 formed on the plate 22 in this embodiment. FIG. 7 shows a spot of the laser beam 5 formed on the plate 22 when the beam restricting plate 27 is removed from this embodiment. In FIGS. 6 and 7, the points at the center represent the optical axis AX, the outermost circle corresponds a circumference of a laser beam, and the other concentric circles represent bright rings BR of an airy pattern (i.e. peak positions of the laser beam intensity). Of the bright rings BR in FIG. 7, the ones other than the bright rings which a Fraunhofer's diffraction image originally has are bright rings of interference fringes by the previously-described interference between laser beams at the first and second surfaces of the lens.

Figure 4:
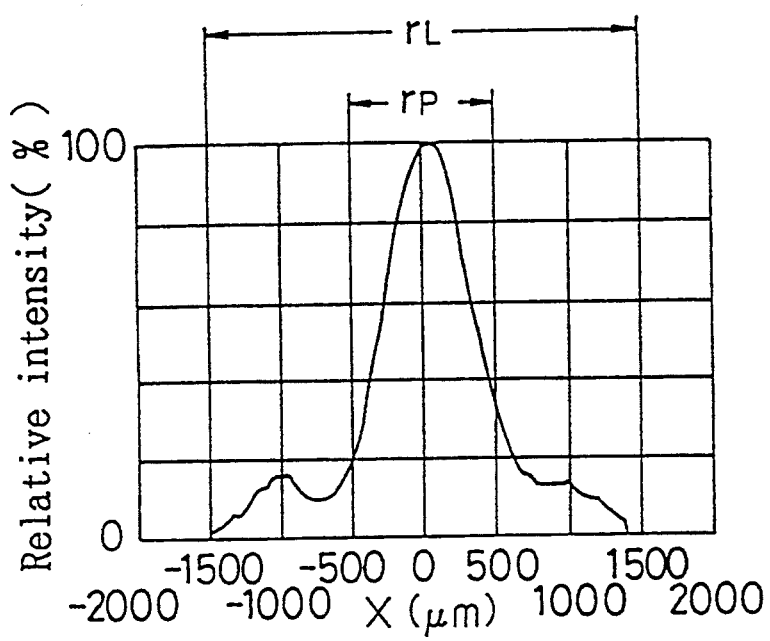
FIG. 4 graphically shows the profile of the intensity of the laser beam after it has passed through the pinhole in the embodiment of the present invention.
Figure 5:
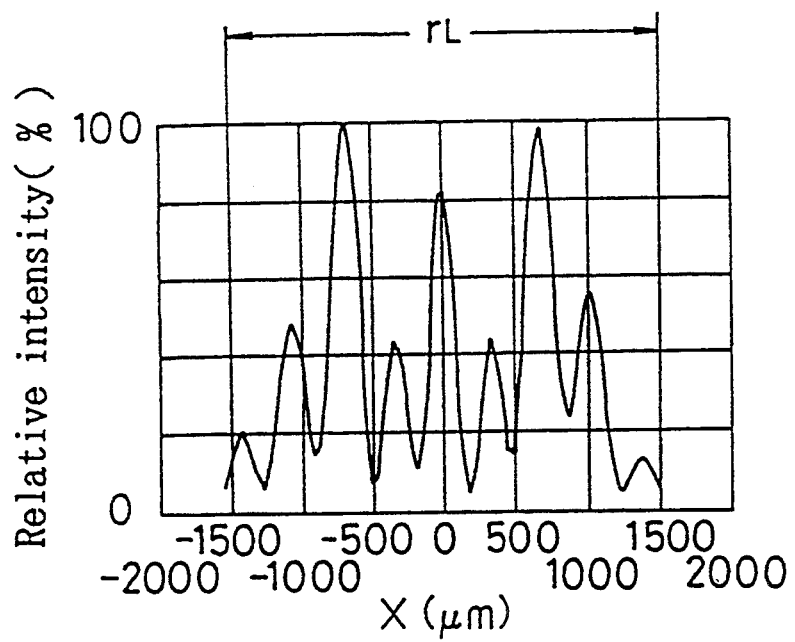
FIG. 5 graphically shows the profile of the laser beam before it is incident on the pinhole in the embodiment of the present invention.

A spot of the laser beam 5 after it has passed through the pinhole 25 was scanned by the movements of the plate 22 and the photodiode 40, and the profile of the laser beam intensity shown in FIG. 4 was obtained from the light quantity of each portion of the spot of the laser beam 5. Moreover, removing the beam restricting plate 27 from this embodiment, a spot of the laser beam 5 before it passes through the pinhole 25 was scanned similarly to the case of the measurement of FIG. 4, and the profile of the laser beam intensity shown in FIG. 5 was obtained from the light quantity of each portion of the spot of the laser beam 5. In FIGS. 4 and 5, rL represents a diameter of the laser beam 5, and rP represents a diameter of the pinhole 25.

As shown in FIGS. 5 and 7, many nonuniformities appear in the laser beam 5 not having passed through the pinhole 25. The nonuniformities, which are observed as the interference fringes of the beam spot (see FIG. 7), are an effect of the interference due to the reflection by the first and second surfaces of the lens 35 as previously described. On the contrary, as shown in FIGS. 4 and 6, hardly any nonuniformities appear in the laser beam 5 having passed through the pinhole 25, which laser beam 5 has a large peak of the beam intensity at the optical axis. According to this embodiment, even though the lens 35 is not anti-reflection coated, the nonuniformity of the beam intensity generated due to the interference between laser beams can be removed by the diffraction by the pinhole 25.

In this embodiment, it is appropriate for practical use that the distance between the laser diode 30 and the lens 35 is 3 to 5 mm and the distance between the lens 35 and the pinhole 25 is approximately 2 to 3 mm.

Generally, since the wavelength of a laser beam increases as the temperature of a laser diode varies, if no pinhole is provided, the pattern of the nonuniformity of the beam intensity changes according to an environmental temperature. According to this embodiment, however, since the nonuniformity itself is restrained to be small, the pattern of the nonuniformity is hardly influenced by a temperature change. As a result, an adjustment in a measurement using a semiconductor laser source will be facilitated.

As described above, according to the present invention, since the laser beam emitted from the beam emitting means and having passed through the optical system passes through the aperture provided in the beam restricting member while being diffracted, a semiconductor laser source can be realized with which the generation of nonuniformity of the laser beam intensity due to the interference between laser beams can be prevented even if the optical system is not anti-reflection coated.

Moreover, since forming the aperture so that its diameter is smaller than the diameter of the laser beam at the beam restricting member enables the diffraction to more effectively occur, the generation of nonuniformity of the beam intensity can be more effectively prevented.

While no semiconductor laser sources have been known which use lenses not anti-reflection coated, since there is no need to coat anti-reflection films, the optical system according to the present invention, the working process can be simplified, the cost of the optical system can be reduced, and consequently, the cost of the semiconductor laser source can be reduced.

Moreover, since the generation of nonuniformity of the beam intensity can be restrained to be extremely small, the pattern of the nonuniformity is hardly influenced by a temperature change. As a result, an adjustment in a measurement using a semiconductor laser source will be facilitated.

Obviously, many modifications and variations of the present invention are possible in light of the above teachings. It is therefore to be understood that within the scope of the appended claims, the invention may be practiced other than as specifically described.

What is claimed is:

1. A semiconductor laser source comprising:
   beam emitting means including a semiconductor laser for emitting a laser beam;

an optical system transmitting and collimating the laser beam emitted from said beam emitting means; and a beam restricting member provided with an aperture of a size which is predetermined so that a central portion of the laser beam from said optical system is transmitted and diffracted while a remaining nonuniform portion of the laser beam is removed.

2. A semiconductor laser source according to claim 1, wherein said beam emitting means comprises a laser diode provided with a laser chip for emitting one laser beam.

3. A semiconductor laser source according to claim 1, wherein said optical system comprises a lens for transmitting the laser beam emitted by the beam emitting means.

4. A semiconductor laser source according to claim 1, wherein said beam restricting member comprises a beam restricting plate of a thin plate form provided with a circular pinhole.

5. A semiconductor laser source according to claim 1, wherein said aperture is smaller than a laser beam diameter at the beam restricting member.

6. A semiconductor laser source according to claim 1, wherein a center of said aperture coincides with a center of the laser beam at the beam restricting member.

7. A semiconductor laser source comprising:
   beam emitting means including a semiconductor laser for emitting a laser beam;
   an optical system transmitting and collimating the laser beam emitted from said beam emitting means;
   a fixing member fixing said beam emitting means and said optical system; and
   a beam restricting member provided with an aperture of a size which is predetermined so that a central portion of the laser beam from the optical system is transmitted and diffracted while the other nonuniform portion of the laser beam is removed.

8. A semiconductor laser source according to claim 7, wherein said beam emitting means comprises a laser diode provided with a laser chip for emitting one laser beam.

9. A semiconductor laser source according to claim 7, wherein said optical system comprises a lens for transmitting the laser beam emitted by the beam emitting means.

10. A semiconductor laser source according to claim 7, wherein said fixing member has a through hole and said beam emitting means and said optical system are inserted into the hole.

11. A semiconductor laser source according to claim 10, wherein said beam emitting means is a laser diode which is fixed in a condition where its head is inserted into the hole, and wherein said optical system is a lens which is fixed inside the hole in a condition where it is fixed inside a lens barrel.

12. A semiconductor laser source according to claim 7, wherein said beam restricting member comprises a beam restricting plate of a thin plate form provided with a circular pinhole.

13. A semiconductor laser source according to claim 7, wherein said beam restricting member is fixed to said fixing member.

14. A semiconductor laser source according to claim 7, wherein said aperture is smaller than a laser beam diameter at the beam restricting member.

* * * * *